(12) United States Patent
Ramappa et al.

(10) Patent No.: US 8,148,237 B2
(45) Date of Patent: Apr. 3, 2012

(54) PRESSURIZED TREATMENT OF SUBSTRATES TO ENHANCE CLEAVING PROCESS

(75) Inventors: Deepak Ramappa, Cambridge, MA (US); Julian G. Blake, Gloucester, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 0 days.

(21) Appl. No.: 12/851,168

(22) Filed: Aug. 5, 2010

(65) Prior Publication Data

US 2011/0201176 A1    Aug. 18, 2011

Related U.S. Application Data

(60) Provisional application No. 61/232,020, filed on Aug. 7, 2009.

(51) Int. Cl.
    *H01L 21/46* (2006.01)
(52) U.S. Cl. .............. 438/456; 438/977; 257/E21.211
(58) Field of Classification Search .............. 438/455, 438/456, 458, 459, 406, 460, 977; 257/E21.211, 257/E21.214, E21.561
    See application file for complete search history.

(56) References Cited

U.S. PATENT DOCUMENTS

| | | | |
|---|---|---|---|
| 4,447,272 A | 5/1984 | Saks | |
| 4,522,657 A | 6/1985 | Rohatgi et al. | |
| 5,374,564 A | 12/1994 | Bruel | |
| 5,877,070 A | 3/1999 | Goesele et al. | |
| 6,033,974 A | 3/2000 | Henley et al. | |
| 6,284,631 B1 | 9/2001 | Henley et al. | |
| 6,346,459 B1 | 2/2002 | Usenko et al. | |
| 6,352,909 B1 | 3/2002 | Usenko | |
| 6,368,938 B1 | 4/2002 | Usenko | |
| 6,486,008 B1 | 11/2002 | Lee | |
| 6,486,041 B2 | 11/2002 | Henley et al. | |
| 6,500,732 B1 | 12/2002 | Henley et al. | |
| 6,537,606 B2 | 3/2003 | Allen et al. | |
| 6,790,747 B2 | 9/2004 | Henley et al. | |
| 6,806,171 B1 | 10/2004 | Ulyashin et al. | |
| 6,809,044 B1 * | 10/2004 | Aspar et al. | 438/120 |
| 7,056,808 B2 | 6/2006 | Henley et al. | |
| 7,459,025 B2 | 12/2008 | Lee | |
| 2004/0166651 A1 * | 8/2004 | Aspar et al. | 438/455 |
| 2009/0232981 A1 | 9/2009 | Blake et al. | |
| 2010/0207212 A1 * | 8/2010 | Takei et al. | 257/347 |

FOREIGN PATENT DOCUMENTS

| | | |
|---|---|---|
| EP | 0961312 A2 | 12/1999 |
| EP | 1806769 A1 | 7/2007 |
| WO | 2004008514 A1 | 1/2004 |
| WO | WO2009084309 * | 7/2009 |

OTHER PUBLICATIONS

A. Misiuk et al., "Effect of Uniform Stress on Silicon Implanted with Helium, Hydrogen, and Oxygen," Comp. Mat. Sci., 2001, vol. 21, pp. 515-525.

(Continued)

*Primary Examiner* — William D Coleman
*Assistant Examiner* — Su Kim

(57) ABSTRACT

A method of cleaving a substrate is disclosed. A species, such as hydrogen or helium, is implanted into a substrate to form a layer of microbubbles. The substrate is then annealed a pressure greater than atmosphere. This annealing may be performed in the presence of the species that was implanted. This diffuses the species into the substrate. The substrate is then cleaved along the layer of microbubbles. Other steps to form an oxide layer or to bond to a handle also may be included.

17 Claims, 4 Drawing Sheets

OTHER PUBLICATIONS

I.V. Antonova et al., "Effect of Stress in Defect Transformation in Hydrogen Implanted Silicon and SOI Structures," Proc. of SPIE, 2001, vol. 4412, pp. 120-125.

Aditya Agarwal et al., "Efficient Production of Silicon-on-Insulator Films by Co-Implantation of He+ with H+," Proc. of 1997 IEEE Intl. SOI Conf., Oct. 1997, pp. 44-45, IEEE.

* cited by examiner

PRESSURIZED TREATMENT OF SUBSTRATES TO ENHANCE CLEAVING PROCESS

CROSS-REFERENCE TO RELATED APPLICATIONS

This application claims priority to the provisional patent application entitled "Pressurized Treatment of Substrates to Enhance Cleaving Process" filed Aug. 7, 2009 and assigned U.S. Application No. 61/232,020, which is hereby incorporated by reference.

FIELD

This invention relates to substrate cleaving, and, more particularly, to a process that forms microbubbles that are used to cleave a substrate.

BACKGROUND

An ion implanter includes an ion source for converting a gas or a solid material into a well-defined ion beam. The ion beam typically is mass analyzed to eliminate undesired ion species, accelerated to a desired energy, and implanted into a target. The ion beam may be distributed over the target area by electrostatic or magnetic beam scanning, by target movement, or by a combination of beam scanning and target movement. The ion beam may be a spot beam or a ribbon beam having a long dimension and a short dimension.

Implantation of an ion species may allow a substrate to be cleaved. The species forms microbubbles in the substrate material. These microbubbles are pockets of a gas or regions of an implanted species below the surface of the substrate that may be arranged to form a weakened layer or porous layer in the substrate. A later process, such as heat, fluid, chemical, or mechanical force, is used to separate the substrate into two layers along the weakened layer or porous layer.

Ostwald ripening may occur in substrates that have microbubbles. Ostwald ripening is a thermodynamic process where larger particles grow by drawing material from smaller particles because larger particles are more stable than smaller particles. Any atoms or molecules on the outside of a particle, which may be, for example, a microbubble, are energetically less stable than the more ordered atoms or molecules in the interior of a particle. This is partly because any atom or molecule on the surface of a particle is not bonded to the maximum possible number of neighboring atoms or molecules, and, therefore, is at a higher energy state than those atoms or molecules in the interior. The unsatisfied bonds of these surface atoms or molecules give rise to surface energy. A larger particle, with a greater volume-to-surface ratio, will have a lower surface energy. To lower surface energy, atoms or molecules on the surface of smaller, less stable particles will diffuse and add to the surface of the larger, more stable particles. The shrinking of smaller particles will minimize total surface area and, therefore, surface energy. Thus, smaller particles continue to shrink and larger molecules continue to grow.

FIG. 1 is a view of Ostwald ripening in a substrate. FIG. 1 is merely an illustration and is not to scale. A species that forms the microbubbles 100 in the substrate 138 makes smaller microbubbles 101 and larger microbubbles 102. Due to their greater volume-to-surface ratio and lower surface energy, the larger microbubbles 102 will be more stable than the smaller microbubbles 101. To lower their surface energy, the smaller microbubbles 101 will diffuse to the larger microbubbles 102 (as illustrated by the dotted lines in FIG. 1). Overall, the smaller microbubbles 101 may shrink and the larger microbubbles 102 may grow. Some of the species in the microbubbles 100 also may diffuse out of the substrate 138 altogether. Ostwald ripening and diffusion of the species out of the substrate 138 will affect the substrate 138 when it is cleaved along the weakened layer or porous layer represented by the dashed line 103.

Previous methods have implanted hydrogen or a combination of hydrogen and helium to cleave a substrate. This typically requires a dose of hydrogen of greater than approximately $2E16$ cm$^{-2}$, such as approximately $6E16$ cm$^{-2}$, or a co-implant of hydrogen and helium with a dose of approximately $1E16$ cm$^{-2}$ each. Such high doses during implant make this cleaving process expensive and time-consuming. Accordingly, there is a need in the art for an improved process to cleave a substrate and, more particularly, a process that will form microbubbles that are used to cleave a substrate.

SUMMARY

According to a first aspect of the invention, a method of cleaving a substrate is provided. The method comprises implanting a species into a substrate to form a layer of microbubbles. The substrate is annealed at a pressure greater than 1 atm in an environment of the species. The substrate is cleaved along the layer of microbubbles.

According to a second aspect of the invention, a method of cleaving a substrate is provided. The method comprises implanting a first dose of a species into a substrate to form a layer of microbubbles. The species may be H or He. The substrate is annealed at a pressure greater than 1 atm in an environment of the species. This annealing diffuses the species into the substrate and forms a second dose of the species in the substrate that is larger than the first dose. The substrate is cleaved along the layer of microbubbles.

According to a third aspect of the invention, a method of cleaving a substrate is provided. The method comprises forming an oxide layer on a substrate. A species is implanted into the substrate to form a layer of microbubbles. The species may be H or He. The substrate is annealed at a pressure greater than 1 atm in an environment of the species, bonded to a handle, and cleaved along the layer of microbubbles.

BRIEF DESCRIPTION OF DRAWINGS

For a better understanding of the present disclosure, reference is made to the accompanying drawings, which are incorporated herein by reference and in which.

DETAILED DESCRIPTION

Figure 1:
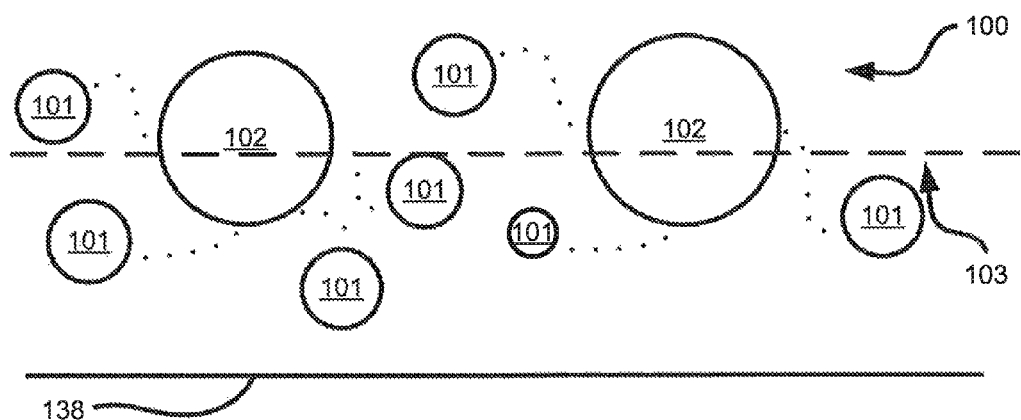
FIG. 1 is a cross-sectional view of Ostwald ripening in a substrate.
Figure 2:
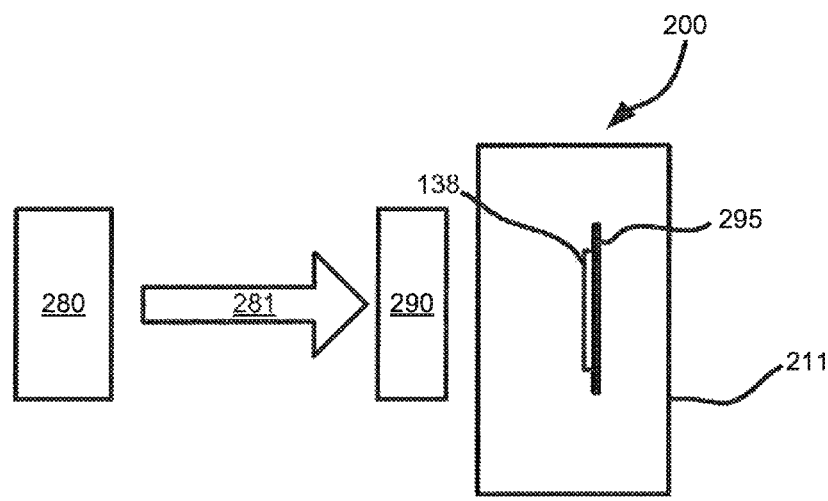
FIG. 2 is a simplified block diagram of a beam-line ion implanter.

FIG. 2 is a simplified block diagram of a beam-line ion implanter. Those skilled in the art will recognize that the beamline ion implanter 200 is only one of many examples of differing beamline ion implanters. In general, the beamline ion implanter 200 includes an ion source 280 to generate ions that are extracted to form an ion beam 281, which may be, for example, a ribbon beam or a spot beam. The ion beam 281 may be mass analyzed and converted from a diverging ion beam to a ribbon ion beam with substantially parallel ion trajectories in one instance. The beamline ion implanter 200 may further include an acceleration or deceleration unit 290 in some embodiments.

An end station 211 supports one or more workpieces, such as the substrate 138, in the path of the ion beam 281 such that ions of the desired species are implanted into substrate 138. In one instance, the substrate 138 may be a semiconductor wafer having a disk shape, such as, in one embodiment, a 300 mm diameter silicon wafer. However, the substrate 138 is not limited to a silicon wafer. The substrate 138 also could be, for example, a flat panel, solar, or polymer substrate. The end station 211 may include a platen 295 to support the substrate 138. The end station 211 also may include a scanner (not shown) for moving the substrate 138 perpendicular to the long dimension of the ion beam 281 cross-section, thereby distributing ions over the entire surface of substrate 138.

The ion implanter 200 may include additional components known to those skilled in the art such as automated workpiece handling equipment, Faraday sensors, or an electron flood gun. It will be understood to those skilled in the art that the entire path traversed by the ion beam is evacuated during ion implantation. The beamline ion implanter 200 may incorporate hot or cold implantation of ions in some embodiments.

One skilled in the art will recognize other systems and processes involved in semiconductor manufacturing, other systems and processes involved in plasma treatment, or other systems and processes that use accelerated ions that may perform the process described herein. Some examples of this, for example, are a plasma doping tool, an ion shower, or a plasma immersion tool. Other semiconductor processing equipment known to those skilled in the art that can accelerate species and implant species into a substrate also may be used. Thus, this process is not limited solely to beam-line ion implanters.

Figure 3:
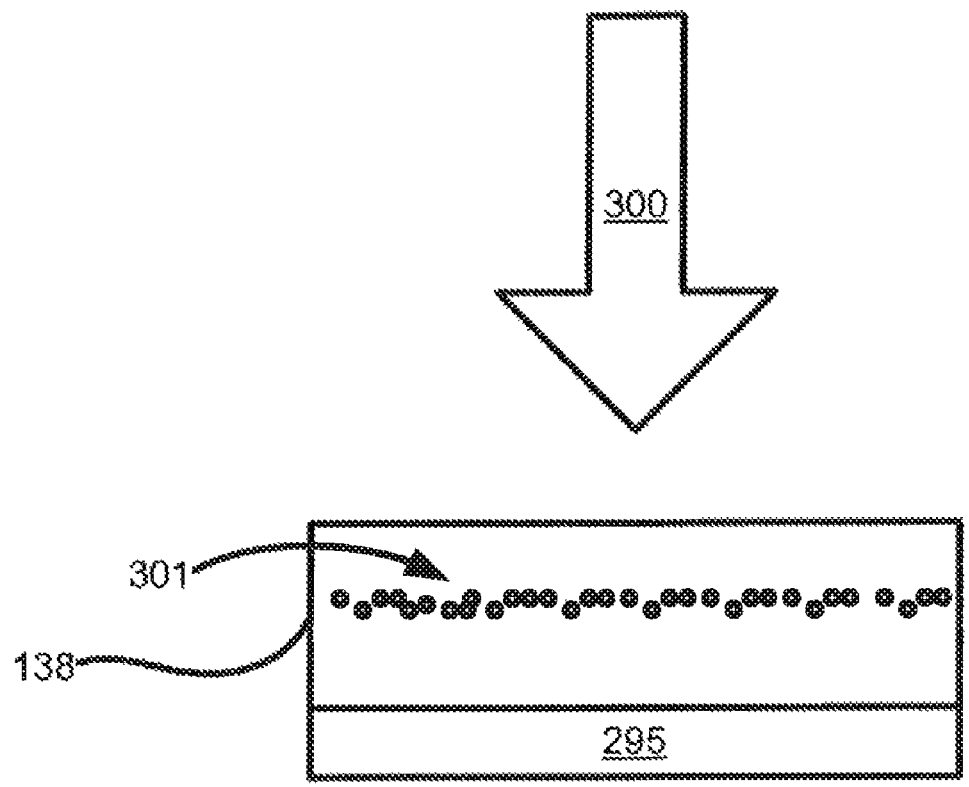
FIG. 3 is a cross-sectional view of an embodiment of an implanted substrate with a layer of microbubbles.

FIG. 3 is an embodiment of an implanted substrate with a layer of microbubbles. A species 300, which may be at least one chemical element in this particular embodiment, is implanted into the substrate 138. In some embodiments, hydrogen may be implanted at approximately $6E16$ cm$^{-2}$ or helium and hydrogen co-implants may be implanted at approximately $1E16$ cm$^{-2}$ to produce a layer of microbubbles 301 below the surface of the substrate 138. The substrate is later cleaved along this layer of microbubbles 301. In other embodiments, oxygen, nitrogen, other rare or noble gases, or a combination of gases are used to form the layer of microbubbles 301. This may be performed in one implant or a series of implants. Other species known to those skilled in the art also may be used to form the layer of microbubbles 301. Greater implant energy of the species 300 generally will result in a greater implant depth of microbubbles 301. Greater implant dose of the species 300 generally will result in a greater concentration of the species 300 that form the microbubbles 301.

FIGS. 4A-4E are cross-sectional views of an embodiment of cleaving with diffusion. Embodiments of this process may be applied to, for example, silicon-on-insulator (SOI) or 3D integrated circuit (IC) or stacked chip configurations. This process also may be applicable to the fabrication of substrates that are used in, for example, flat panels, thin films, solar cells, LEDs, other thin metal sheets, or other devices. The substrate that is cleaved using this process may be, for example, Si, SiC, GaN, GaP, GaAs, polysilicon, Ge, quartz, or other materials.

In fabricating a cleaved workpiece, a substrate 138 is provided (A). The substrate 138 may be referred to as a donor substrate. At least one species 300, such as hydrogen, helium, or hydrogen and helium, for example, is implanted (B) into the substrate 138 to form a layer of microbubbles 301 (as illustrated by the dotted line in FIG. 4B). Forming the microbubbles 301 with the species 300 also may include creating damage sites where the microbubbles 301 grow either during implant or a later processing step. Other species such as oxygen, nitrogen, other rare or noble gases, or a combination of gases also may be implanted. This may be a low-dose implant of approximately $1E14$ cm$^{-2}$ to approximately $2E15$ cm$^{-2}$ in one instance. The layer of microbubbles 301 are a distance (Rp) below the surface of the substrate 138. The layer of microbubbles 301 initiates a defect plane at the desired depth, which depends on the implant energy. Compared to a dose previously used to cleave a substrate 138 without further implant or diffusion steps, this particular implant to form the microbubbles 301 may use a lower implant dose.

In one particular embodiment, the temperature of the substrate 138 is increased during the implant. This may be from about 100° C. to about 400° C. If the dose of the species 300 is above the amorphizing threshold, the end-of-range defect density (defect slip lines) tends to be higher. This may remove the need for an annealing step (C) in one instance. The substrate 138 may be heated with lamps or using the platen 295 as seen in FIGS. 2-3. The substrate 138 may be heated during implant or pre-heated prior to implant.

Following formation of the microbubbles 301, the defect planes are formed during an anneal (C) of, for example, between approximately 400° C. and approximately 600° C. The annealing will grow the microbubbles 301 using Ostwald ripening. In one instance, the anneal is for approximately 500-600° C. for about 5-10 minutes. The temperature and duration of the anneal is optimized for the type of the substrate 138.

Following the anneal (C), the substrate 138 is annealed in a low-temperature, high-pressure ambient of species 500 that is diffused into the substrate 138 (D). The species 500 may be, for example, hydrogen, helium, or hydrogen and helium. The species 500 may be mixed with a dilutant gas, such as nitrogen. The temperature during diffusion may be, for example, between approximately 200° C. and approximately 400° C., though other temperatures are possible. The high-pressure process provides an abundant source of the species 500 at the surface of the substrate 138. This forces the species 500 to diffuse into the substrate 138 and to decorate the defects in the substrate 138 caused by the microbubbles 301. Thus, the dose of the species that forms the microbubbles 301 increases from the initial implanted dose to a second, higher dose. In one embodiment, the second, higher dose is approximately $7E16$ cm$^{-2}$ for hydrogen in a silicon substrate 138. The second, higher dose may be an order of magnitude greater for a GaN substrate 138.

In one instance, the species 500 matches the species 300, though the species 500 and species 300 also may be different. In one embodiment, the species 300 and species 500 may both be hydrogen. This enables growth of the microbubbles 301 without any interactions. In another embodiment, the species 300 and species 500 may both be a combination of hydrogen and helium. In yet another embodiment, the species 300 is hydrogen or nitrogen and the species 500 is helium or neon. If the substrate 138 is silicon, the species 300 may be chemically-reactive to assist in stabilizing the wall of the individual microbubbles 301 while the species 500 may diffuse through silicon. The species 500 and species 300 may be selected to stabilize and fill the microbubbles 301.

This higher pressure in step D may be, for example, approximately 2× to several 100× greater than atmospheric pressure because at a lower pressure, the species 500 tends to diffuse to the ambient rather than into the substrate 138. In one particular embodiment, the pressure is approximately 10× to 20× greater than atmospheric pressure. The temperature during step D is configured to increase the diffusion of the species 500 into the substrate 138 and increase the solubility of the species 500 in the substrate 138. In one particular instance, this temperature is between 400° C. and 800° C. The duration of this step D is determined by the type of substrate 138 and the amount of species 500 that is needed for cleaving.

This species 500 will cause Ostwald ripening of the largest microbubbles 301. The species 300 formed nucleus cavities that hold the species 500 during the anneal. These nucleus cavities caused by species 300 may be damage to the substrate 138. Crystalline silicon, for example, has all its bonds satisfied. If the bonds are broken, the hydrogen, for example, will preferentially attach to the dangling bonds and form the nucleus cavities. Helium is a noble gas and not as reactive as hydrogen, but may in one instance "stuff" a nucleus cavity formed by hydrogen. Other species may do the same.

During the thermal diffusion, an anneal, or another thermal process, the substrate 138 fractures or cleaves along the layer of microbubbles 301 (E). In another embodiment, a mechanical, chemical, or fluid force is used to fracture or cleave the substrate 138 along the layer of microbubbles 301. The remaining substrate 138 that is cleaved off may be reused in some embodiments. In another particular embodiment, the substrate 138 is bonded to another workpiece, such as a handle, prior to fracturing or cleaving the substrate 138 along the layer of microbubbles 301. The substrate 138 may require polishing in one instance.

The diffusion of species 500 into the substrate 138 reduces the dose of the species 300 required to cleave the substrate 138. This significantly reduces the cost of the cleaving process because the entire dose of the species 300 does not need to be implanted into the substrate 138. In an alternate embodiment, the anneal (C) and the diffusion (D) are performed at least partially simultaneously. This combined anneal (C) and diffusion (D) is a high-pressure, high-temperature process. In yet another embodiment, the species 500 is diffused into the substrate 138 during a plasma-enhanced chemical vapor deposition (PECVD) process.

FIGS. 5A-5H are cross-sectional views of an embodiment of SOI substrate fabrication that uses substrate cleaving with diffusion. Embodiments of this process are not solely limited to SOI substrates. Embodiments of this process are applicable to other cleaving implants such as 3D IC or stacked chip configurations. This process also may be applicable to the fabrication of substrates that are used in, for example, flat panels, thin films, solar cells, LEDs, other thin metal sheets, or other devices. The substrate that is cleaved using this process may be, for example, Si, SiC, GaN, GaP, GaAs, polysilicon, Ge, quartz, or other materials known to those skilled in the art.

In fabricating an SOI substrate, a substrate 138 is provided (A). The substrate 138 may be referred to as a donor substrate. The substrate 138 has a thermal oxide layer 400 formed on at least one surface (B). At least one species 300, such as hydrogen or helium, for example, is then implanted (C) into the silicon of the substrate 138 to form a layer of microbubbles 301 (as illustrated by the dotted line in FIG. 5C). Other species such as oxygen, nitrogen, other rare or noble gases, or a combination of gases also may be implanted.

Figure 4:
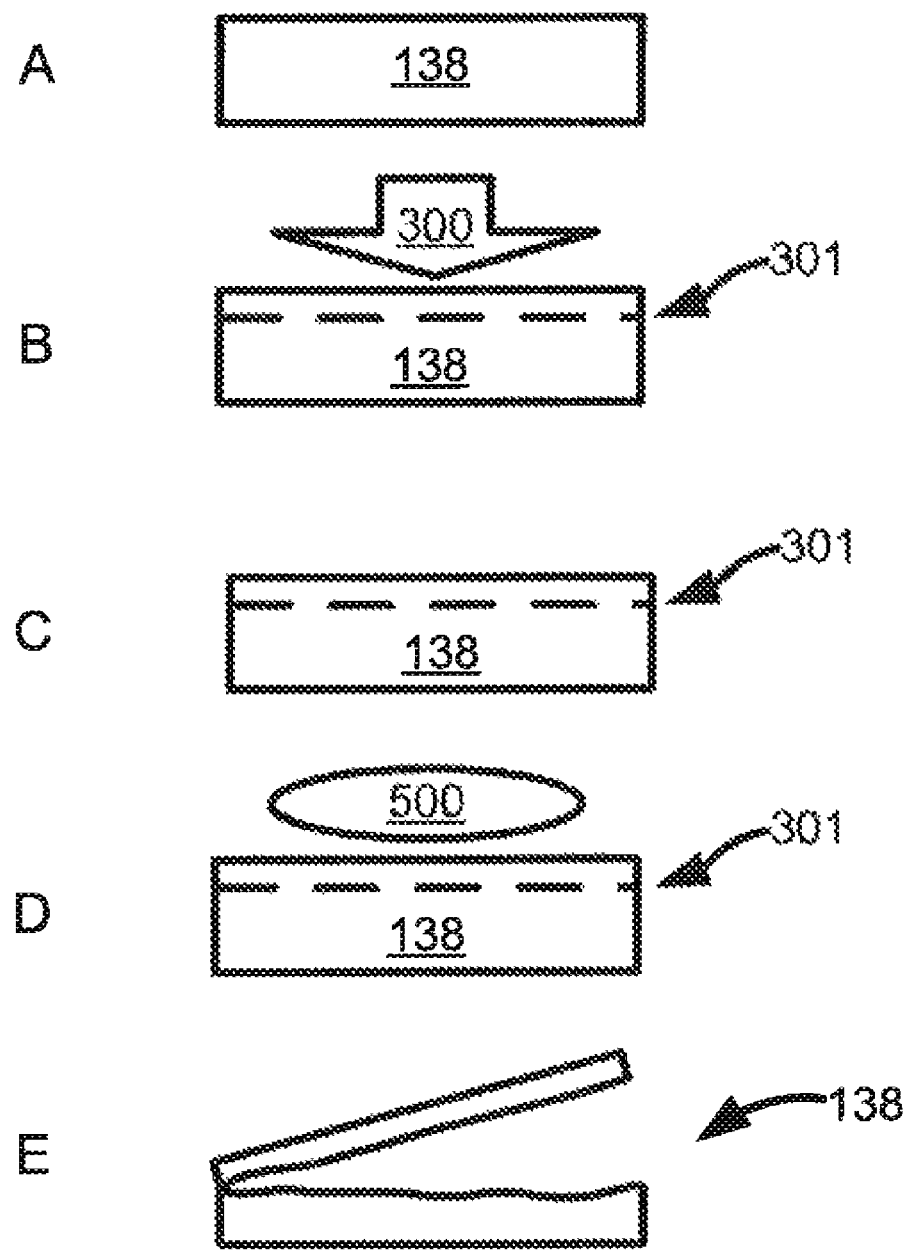
FIGS. 4A-4E are cross-sectional views of an embodiment of cleaving with diffusion.
Figure 5:
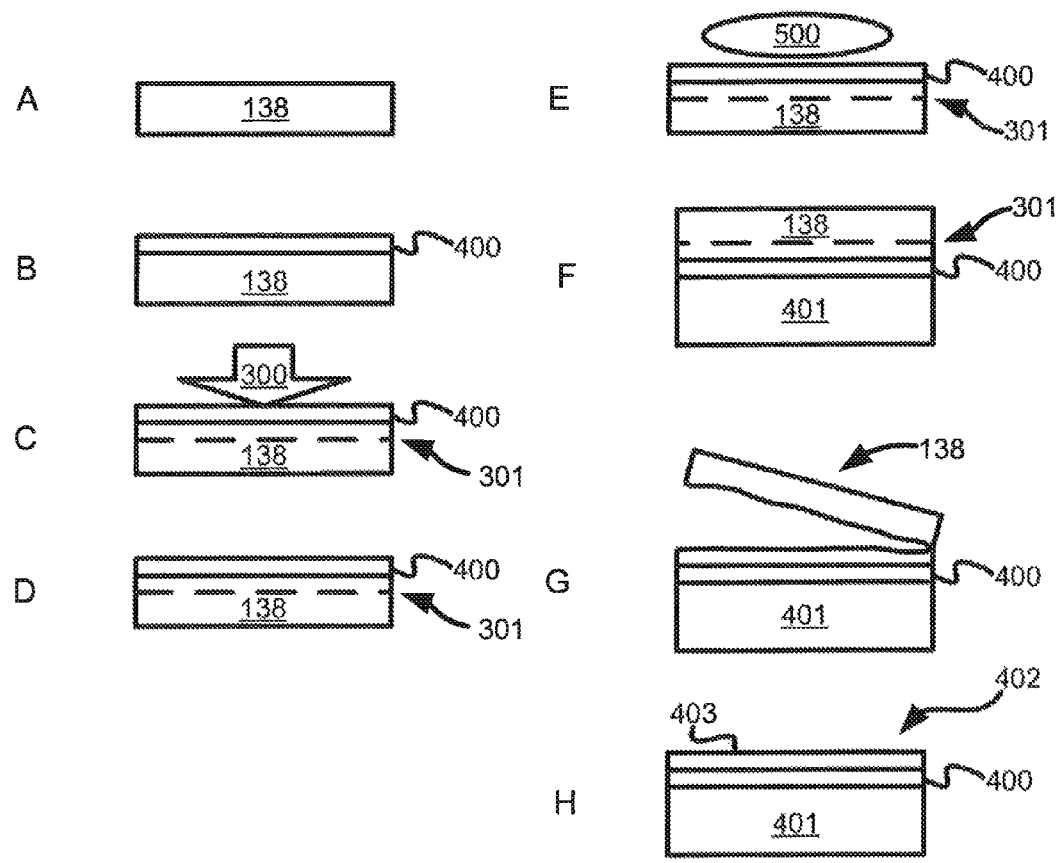
FIGS. 5A-5H are cross-sectional views of an embodiment of silicon-on-insulator (SOI) substrate fabrication that uses substrate cleaving with diffusion.

The substrate is subject to an anneal (D) similar to step C in FIG. 4. A species 500 is then diffused into the substrate 138 (E) similar to step D of FIG. 4. The species 500 may be, for example, hydrogen, helium, or hydrogen and helium. In one instance, the species 500 matches the species 300, though the species 500 and species 300 also may be different. This species 500 will cause Ostwald ripening of the largest microbubbles 301. Of course, the anneal (D) is optional and may be removed if the implant (C) is performed at about 100° C. to about 400° C.

This substrate 138 is then flipped over, bonded to a handle 401, and annealed (F). In some embodiments, the substrate 138 is cleaned prior to bonding it to the handle 401. During the anneal or another thermal process, the substrate 138 fractures or cleaves along the layer of microbubbles 301 (G). The formed SOI substrate 402, including the thermal oxide layer 400 and silicon overlayer 403, may require polishing to make the surface smooth enough for device manufacture (H). In another embodiment, a mechanical, chemical, or fluid force is used to fracture or cleave the substrate 138 along the layer of microbubbles 301. The remaining substrate 138 may be reused in some embodiments.

For any of the embodiments of FIGS. 5A-5H, the dose of species 300 during ion implantation is lowered compared to a dose of a species 300 implant without diffusion of species 500, leading to cost savings. In an alternate embodiment, the anneal (D) and the diffusion (E) are performed at least partially simultaneously. This combined anneal (D) and diffusion (E) is a high-pressure, high-temperature process. In yet another embodiment, the species 500 is diffused into the substrate 138 during a PECVD process.

The surface roughness of the SOI substrate 402 and the silicon overlayer 403 after cleaving depends on the size of the microbubbles in the layer of microbubbles 301. Smaller microbubbles in the layer of microbubbles 301 will lead to a smoother surface of the SOI substrate 402 and the silicon overlayer 403 after cleaving. This may eliminate or limit the polishing step in some embodiments.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of cleaving a substrate comprising:
   implanting a species into a substrate to form a layer of microbubbles;
   annealing said substrate at a temperature between 500° C. and 600° C.;
   annealing said substrate at a pressure greater than 1 atm in an environment of said species after said annealing said substrate at said temperature between 500° C. and 600° C.; and
   cleaving said substrate along said layer of microbubbles.

2. The method of claim 1, wherein said substrate is composed of a material selected from the group consisting of Si, SiC, GaN, GaP, GaAs, and Ge.

3. The method of claim 1, wherein said species is selected from the group consisting of H, He, O, N, and another noble gas.

4. The method of claim 1, wherein said cleaving is selected from the group consisting of a thermal process, a chemical treatment, a fluid force, and a mechanical force.

5. The method of claim 1, wherein said pressure is between 2 atm and 100 atm.

6. The method of claim 1, further comprising diffusing said species into said substrate during said annealing at said pressure greater than 1 atm.

7. The method of claim 1, wherein said implanting is at a temperature of between 100° C. and 400° C.

8. The method of claim 1, wherein said annealing at said pressure greater than 1 atm is at a temperature between 200° C. and 400° C.

9. The method of claim 1, further comprising bonding said substrate to a handle prior to said cleaving.

10. A method of cleaving a substrate comprising:
   implanting a first dose of a species into a substrate to form a layer of microbubbles, said species selected from the group consisting of H and He;
   annealing said substrate at a pressure greater than 1 atm in an environment of said species, said annealing diffusing said species into said substrate and forming a second dose of said species in said substrate larger than said first dose; and
   cleaving said substrate along said layer of microbubbles.

11. The method of claim 10, wherein said substrate is composed of a material selected from the group consisting of Si, SiC, GaN, GaP, GaAs, and Ge.

12. The method of claim 10, wherein said cleaving is selected from the group consisting of a thermal process, a chemical treatment, a fluid force, and a mechanical force.

13. The method of claim 10, wherein said pressure is between 2 atm and 100 atm.

14. The method of claim 10, further comprising annealing said substrate at a temperature between 500° C. and 600° C. after said implanting and prior to said annealing said substrate at said pressure greater than 1 atm.

15. The method of claim 10, wherein said implanting is at a temperature of between 100° C. and 400° C.

16. The method of claim 10, wherein said annealing is at a temperature between 200° C. and 400° C.

17. The method of claim 10, further comprising bonding said substrate to a handle prior to said cleaving.

* * * * *